United States Patent
Kurosawa et al.

[11] Patent Number: 6,071,349
[45] Date of Patent: Jun. 6, 2000

[54] GAS SUPPLYING APPARATUS AND VAPOR-PHASE GROWTH PLANT

[75] Inventors: Yasushi Kurosawa, Annaka; Kyoji Oguro, Nishishirakawa-gun; Yutaka Ota; Yuji Okubo, both of Annaka, all of Japan

[73] Assignee: Shin-Etsu Handotai Co., Ltd., Tokyo, Japan

[21] Appl. No.: 08/893,540

[22] Filed: Jul. 11, 1997

[30] Foreign Application Priority Data

Jul. 12, 1996 [JP] Japan .................................. 8-202959

[51] Int. Cl.⁷ .................................................. C23C 16/00
[52] U.S. Cl. ........................................... 118/715; 156/345
[58] Field of Search .............................. 118/715; 156/345

[56] References Cited

U.S. PATENT DOCUMENTS

| | | | |
|---|---|---|---|
| 5,244,500 | 9/1993 | Ebata ........................................ | 118/697 |
| 5,470,390 | 11/1995 | Nishikawa et al. ...................... | 118/719 |
| 5,517,943 | 5/1996 | Takahashi ................................ | 118/715 |

*Primary Examiner*—Richard Bueker
*Assistant Examiner*—Erin Fieler
*Attorney, Agent, or Firm*—Snider & Associates; Ronald R. Snider

[57] ABSTRACT

A vapor-phase growth plant which has a dopant gas supplying apparatus comprising a plurality of dopant gas supplying containers, and a multiple stage gas flow subsystem with a plurality of dopant gas supply conduits therein, of which said dopant gas supply conduits form a tournament-style network with a plurality of confluences on which the dopant gas supply conduits are united and the gas flows therein are merged for subjection to even mixing which results in gradual decreasing of the number of the dopant gas supply conduits as the dopant gas flows proceed in the multiple stage gas flow subsystem. Together with the equipped pressure reducing valves, the dopant gas which is highly evened in its pressure and its concentration can be supplied to the vapor-phase growth apparatus, thereby affording stable production of vapor-phase growth products with extremely lessened quality variance. The dopant gas supplying apparatus described compiles the gas supply conduits within it to two groups, each of which can be used alternatively by switching of these. Therefore, the apparatus can supply dopant gas continuously and for a longer period. Also the operation of the dopant gas supplying apparatus can be simplified.

8 Claims, 3 Drawing Sheets

GAS SUPPLYING APPARATUS AND VAPOR-PHASE GROWTH PLANT

The present disclosure relates to subject matter contained in Japanese patent application No. 202959/1996/ (filed on Jul. 12, 1996) which is expressly incorporated herein by reference in its entirety.

BACKGROUND OF THE INVENTION

1. Field of the Invention

This invention relates to a gas supplying apparatus for supplying high pressure gas flowing from gas containers to chemical processing apparatus by reducing said gas pressure.

Moreover, this invention relates to a vapor-phase growth plant comprising a dopant gas conduction means for supplying high pressure dopant gas flowing from dopant gas containers to vapor-phase growth apparatus by reducing said dopant gas pressure.

2. Description of the Prior Art

A well known prior art gas supplying apparatus is configured such that chemical processing gas, filled as compressed gas or liquefied gas in a gas container or gas cylinder, is supplied through piping system via pressure reducing valve to chemical processing apparatus.

FIG. 4 illustrates the schematic configuration of a vapor-phase growth plant as an example of such conventional gas supplying apparatus.

According to the drawings, the vapor-phase growth plant has a gas supplying container(or gas cylinder) 61 which is filled up with dopant gas (for example, $H_2$ diluted $B_2H_6$: diborane gas) 62. The dopant gas flows through a dopant gas supply piping 64 via a pressure reducing valve 63 to a thin film growth chamber 65a disposed in a vapor-phase growth apparatus 65. In the thin film growth chamber 65a, the dopant gas is supplied on a substrate which is loaded in the chamber for growing thin film by vapor-phase growth on the surface of the substrate.

For the purpose of removing any contaminants in the dopant gas supply piping 64 which may intrude from surroundings, a gas purging apparatus is connected to the dopant gas supply piping 64. The gas purging apparatus is equipped a purging gas supplying conduit 66 and a purging gas discharge conduit 67 respectively therewith.

As for purging gas, nitrogen gas ($N_2$) or rare gas (Ar, He etc.) are adopted. The part which is closed by a dotted line in the FIG. 4 shows cylinder cabinet 68 for storing the gas supplying container 61.

As shown above, in the prior art, the cylinder cabinet 68 is disposed on one-for-one correspondence to the vapor-phase growth apparatus 65. The reason for this is that a gas supplying container commonly used, as usual, has some variance in dopant gas concentration. Therefore, upon replacing of the dopant gas supplying container, dopant gas concentration may vary for some extent, which may result in variance on atomic concentration of the grown thin film produced in the vapor-phase growth apparatus 65, though operated in the same situation or the same film growing condition.

In consequence, to avoid undesirable variance of dopant concentration in the grown thin film caused by replacing the dopant gas supplying container, thin film growth condition by the vapor-phase growth apparatus must be adjusted respectively in accordance with the dopant gas concentration of each dopant gas supplying container.

However, since the cylinder cabinet 68 is disposed on one-for-one correspondence to the vapor-phase growth apparatus 65 in the conventional vapor-phase growth plant, the following problem arise:

(1) As the number of vapor-phase growth apparatus 65 increases, the number of cylinder cabinet 68 must be increased, which results in the increase of plant installation cost.

(2) In order to avoid variance in grown thin film quality (dopant concentration) upon replacing of gas supplying containers, the production condition must be adjusted, which result in the lesser productivity because of the increase of adjusting time.

(3) Upon replacing of gas supplying containers, such troublesome operations as the substituting of residual gas in the dopant gas supplying pipe with the purging gas would be required.

(4) Ever since the gas supplying container is rather small in volume, duration on continuous operation is short.

SUMMARY OF THE INVENTION

The present invention, produced in the light of the true state of prior art described above, has for an object thereof for providing a gas supplying system which enables to supply highly homogenized high pressure gas in terms of its concentration together with its pressure, stably and for a long period to chemical processing apparatus.

Another object of the invention is to improve productivity of chemical processing apparatus.

Still another object of the invention is to realize simplified operation of gas supplying apparatus.

A further substantial object of the invention is to provide vapor-phase growth plant for capable of stable production of qualified thin film with lesser variance in its quality.

The first aspect of the invention resides in a gas supplying apparatus for supplying high pressure gas flowing from gas supplying containers which are filled said gas therein, through gas conduction means being equipped pressure reducing valves therewith, to at least one chemical processing apparatus, which gas supplying apparatus is characterized by comprising a plurality of gas supplying containers each of which having outlet for simultaneous supplying of the gas flow therefrom, and a gas conduction means for conducting the gas flow having a plurality of gas supply conduits being connected to each outlet of the gas supplying containers therewith, which gas supply conduits forming a multiple stage network with a plurality of confluence to merge and to unite the gas supply conduits respective thereat along with the gas flow direction, thereby reducing the number of gas supply conduits, which the final stage of the multiple stage network being formed at the final stage confluence single gas supply conduit thereof, being connected through at least one pressure reducing valve at least one of chemical processing apparatus therewith, whereby enabling gas flow rate of each gas container being flown out therefrom to even, by making even of pressure drop within the gas supply conduits jointly connected between each of the outlet of each gas container and the final stage conflux therethrough.

The second aspect of the invention resides in a gas supplying apparatus set forth in the first aspect of this invention, wherein the gas conduction means of which the gas supply conduits comprising a multiple stage tournament-style network, by merging and uniting the gas supply conduits on the respective confluence.

The third aspect of the invention resides in a gas supplying apparatus set forth in the first or second aspect of this invention, further comprising at least one gas buffering means being disposed by insertion between an outlet of the pressure reducing valve at the final stage confluence and the respective chemical processing apparatus therewith.

The fourth aspect of the invention resides in a gas supplying apparatus set forth in the first or second or third aspect of this invention, further comprising at least one gas purging apparatus being equipped with at least one purging gas supplying conduit and with at least one purging gas discharge conduit and with at least one decompression exhaust conduit.

The fifth aspect and function of the invention resides in a gas supplying apparatus set forth in any of the first to fourth aspect of this invention, in which each gas supplying conduit having the same inner diameter and the same length and the same bending configuration so as to even pressure drop within the gas conduction means disposed between each gas supplying container and respective confluence.

The sixth aspect and function of the invention resides in a gas supplying apparatus set forth in any of the first to fifth aspect of this invention, in which high pressure gas being dopant gas, and the chemical processing apparatus being vapor-phase growth apparatus.

The seventh aspect of the invention resides in a vapor-phase growth plant having at least one gas supplying container being filled up with high pressure dopant gas therein to flow therefrom, at least one vapor-phase growth apparatus and a dopant gas conduction means together with at least one pressure reducing valve thereof, for growing of thin film in the presence of the dopant gas supplied therefrom through the dopant gas conduction means on respective substrate disposed within respective vapor-phase growth apparatus, which vapor-phase growth plant is characterized by comprising a plurality of dopant gas supplying containers each of which having outlet for simultaneous supplying of the dopant gas flow therefrom, and a gas conduction means for conducting the dopant gas flow having a plurality of gas supply conduits being connected to each outlet of the dopant gas supplying containers therewith, which gas supply conduits forming a multiple stage network with a plurality of confluence to merge and to unite the gas supply conduits respective thereat along with the gas flow direction, thereby reducing the number of gas supply conduits, which the final stage of the multiple stage network being formed at the final stage confluence single gas supply conduit thereof, being connected through at least one pressure reducing valve at least one of vapor-phase growth apparatus therewith, whereby enabling dopant gas flow rate of each gas supplying container being flown out therefrom to even, by making even of pressure drop within the gas supply conduits jointly connected between each of said outlet of each gas supplying container and the final stage confluence therethrough.

Moreover, as the substantial example of high pressure gas, dichlorosilane or monosilane are applicable as gas phase raw material to be used for vapor-phase growth of thin film, while phosphine, diboran, arsine or others are also applicable as dopant gas which are added for vapor-phase growth of thin film.

BRIEF DESCRIPTION OF THE DRAWINGS

The invention will be better understood and the objects and features thereof other than those set forth above will become apparent when consideration is given to the following detailed description thereof, which makes reference to the following drawings, wherein.

DETAILED DESCRIPTION OF THE PREFERRED EMBODIMENTS

Figure 1:
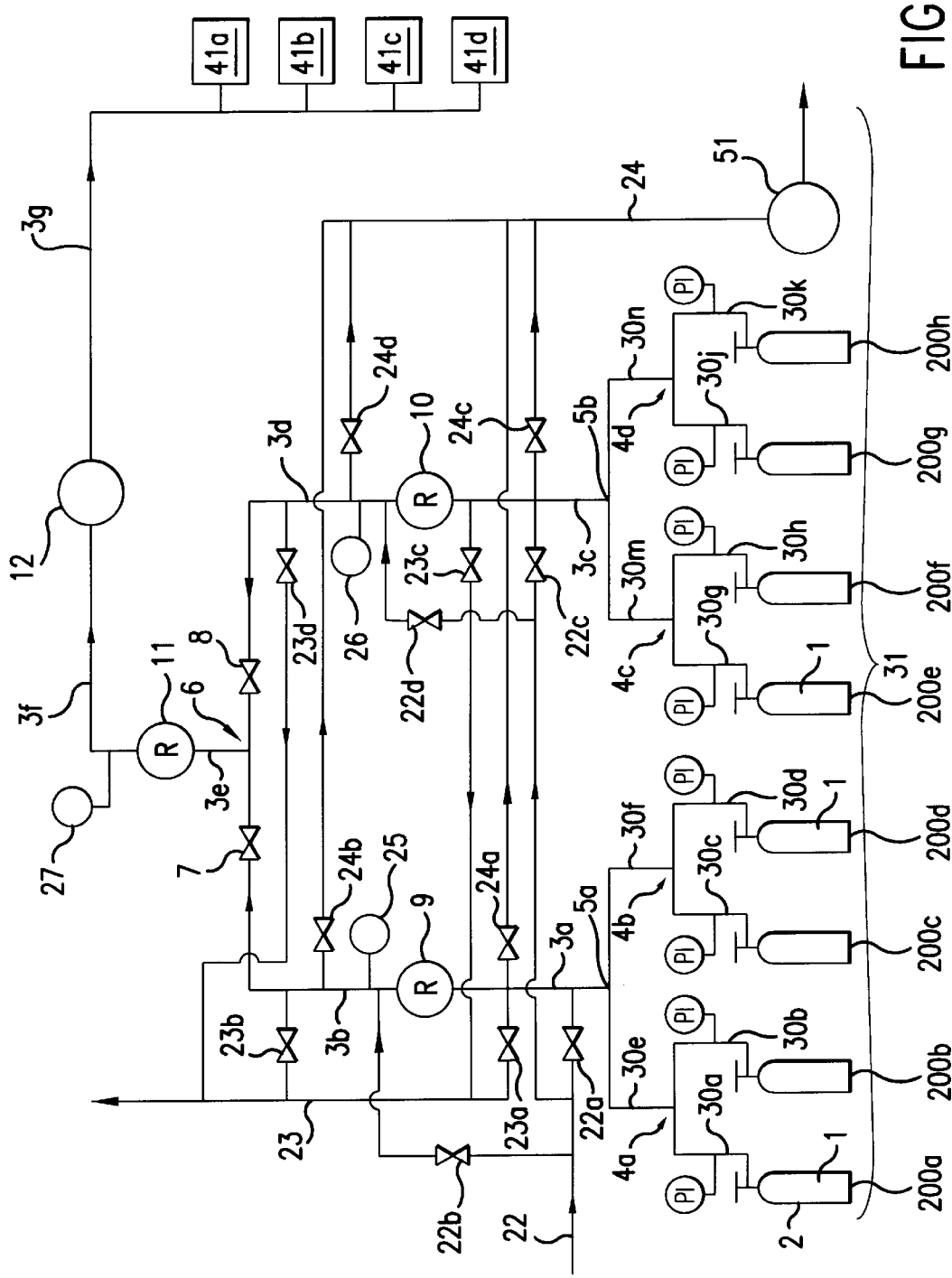
FIG. 1 is a flowsheet illustrating an example of the vapor-phase growth plant according to the present invention.

This invention will more specifically be described below with reference to the preferred embodiments illustrated in the drawings annexed hereto, a vapor-phase growth plant having at least one thin film vapor-phase growth apparatus which correspond to the chemical processing apparatus described above, for growing thin film layer on a substrate therein, in the presence of high pressure dopant gas which also corresponds to the high pressure supplying gas described above.

FIG. 1 is a flow sheet of a vapor-phase growth plant for production of thin film having a dopant gas supplying system and thin film vapor-phase growth apparatus.

As shown in the FIG. 1, the vapor-phase growth plant comprises eight gas supplying containers denoted by notation 200*a*, 200*b*, 200*c*, 200*d*, 200*e*, 200*f*, 200*g*, 200*h* respectively which contain high pressure dopant gas 1, four vapor-phase growth apparatus denoted by notation 41*a*, 41*b*, 41*c* and 41*d* for growing of thin film, plural of dopant gas supply conduits denoted by notation 30*a*, 30*b*, 30*c*, 30*d*, 30*e*, 30*f*, 30*g*, 30*h*, 30*j*, 30*k*, 30*m*, 30*n*, 3*a*, 3*b*, 4*c*, 3*d*, 3*e*, 3*f* and 3*g* which jointly connect between each of the gas containers (200*a* to 200*h*), with each of growth vessels (not shown) equipped in each of the vapor-phase growth apparatus (41*a* to 41*d*).

The gas supply conduits construct a multiple stage gas flow subsystem which corresponds to the gas conduction means described above, a four-stage gas flow subsystem in this case, which successively connects and merges the gas supply conduits from upper gas flow to down gas flow along with the gas flow direction, thereby reducing gradually the number of gas supply conduits so as to shape a tournament-diagram-style network of which paths gradually decrease from the upper end to the down end.

The gas supply conduits 30*a*, 30*b*, 30*c*, 30*d*, 30*g*, 30*h*, 30*j* and 30*k* form the first stage of the multiple stage gas flow subsystem, disposed at the upper end of the subsystem, which of each end connecting to the outlet of each gas containers (200*a* to 200*h*).

Every two of the first stage gas supply conduits in pair are connected and united to one of second stage conduit (30*e*, 30*f*, 30*m* or 30*n*), thereby reducing the number of the second stage conduit to half.

For example, two of the first stage gas supply conduits 30*a* and 30*b* in pair are connected and united on a first stage confluence 4*a*, to a second stage gas conduit 30*e* thereat.

Similarly two of the first stage gas supply conduits 30*c* and 30*d* in pair are connected and united on a first stage confluence 4*b*, to a second stage gas conduit 30*f* thereat.

Also, a pair of the first stage gas supply conduits 30*g* and 30*h* connecting and uniting on a first stage confluence 4*c* to a second stage gas conduit 30m, and a pair of the first stage gas supply conduits 30j and 30k connecting and uniting on a first stage confluence 4d to a second stage gas conduit 30n thereat.

Successively, every two of the second stage gas supply conduits in pair are connected and united to one of third stage conduit, thereby reducing the number of the third stage conduit to half.

For example, two of the second stage gas supply conduits 30e and 30f in pair are connected and united on a second stage confluence 5a, to a third stage gas conduit 3a thereat. The gas conduit 3a is then connected via a pressure reducing valve 9 to a third stage gas conduit 3b.

In the same manner two of the second stage gas supply conduits 30m and 30n in pair are connected and united on a second stage confluence 5b, to a third stage gas conduit 3c thereat. The gas conduit 3c is then connected via a pressure reducing valve 10 to a third stage gas conduit 3d.

Finally, the two of the third stage gas supply conduits in pair are connected and united to a fourth (or final) stage conduit, thereby reducing the number of the final stage conduit to half: more specifically the two of the second stage gas supply conduits 3b and 3d are connected and united on a third stage confluence 6, to a final stage gas conduit 3e thereat.

Though the configuration shown above provides eight gas containers, there exist no restrictions in the number of gas supplying containers, together with the number of gas flow stages: for example, twenty or more gas containers are applicable.

Several of thin film growth chambers are commonly equipped, but not restricted in total number of these.

On the downstream side of the third stage gas supply conduit 3a, a primary pressure reducing valve 9 is disposed while the outlet of the primary pressure reducing valve 9 is connected with a gas supply conduit 3b, of which the opposite end connecting to a two way valve 7 which enabling fully opened or fully closed of gas flow pass.

The output from the two way valve 7 is conducted to the third stage confluence 6.

Likewise to the above, on the downstream side of the third stage gas supply conduit 3c, a primary pressure reducing valve 10 is disposed while the outlet of the primary pressure reducing valve 10 is connected with a gas conduit 3d, of which the opposite end connecting to a two way valve 8 which enabling fully opened or fully closed of gas flow pass. The output from the two way valve 8 is conducted also to the third stage conflux 6.

With the configuration described above, the primary pressure reducing valve 9 (or 10) is placed on the upper stream side while the two way valve 7 (or 8) is placed on the down stream side, in tandem connection: contrary to this, a reverse configuration of arranging the two way valve 7 (or 8) on the upper stream side while the primary pressure reducing valve 9 (or 10) on the down stream side in tandem connection is also applicable.

In parallel to the primary pressure reducing valve 9 or 10, another two way valve (not shown) enabling fully opened or fully closed of gas flow pass can also be disposed.

With the two way valve and the primary pressure reducing valve 9 or 10, the dopant gas can be supplied through either the primary pressure reducing valve 9 or 10, or bypassing through the two way valve, to the succeeding stage.

On the down stream side of the final stage where two of the gas supply conduit 3b and 3d are merged to a sole gas supply conduit 3e, a secondary reducing valve 11 is disposed connecting its inlet to the down end of the gas supply conduit 3e. Also, the outlet of the secondary reducing valve 11 is connected with a gas conduit 3f of which the opposite end connecting to a buffer tank 12. A gas supply conduit 3g connects between the outlet of the buffer tank 12 and each inlet of four units of vapor-phase growth apparatus 41a, 41b, 41c and 41d.

The gas supply conduits (3a to 3d and 30a to 30n) which connect between each gas supplying containers (200a to 200h) and the two way valves (7 and 8) are connected with a gas purging apparatus comprising of a purging gas supply conduit 22 and with a purging gas discharge conduit 23 and with a decompression exhaust conduit 24.

Notations 22a, 22b, 22c and 22d denote two way valves which are connected to the purging gas supply conduit 22 while notations 23a, 23b, 23c and 23d denote two way valves which are connected to the purging gas discharge conduit 23, and notations 24a, 24b, 24c and 24d denote two way valves which are connected to the decompression exhaust conduit 24, and notations 25, 26 and 27 denote pressure gauges respectively. Notation 51 denotes an ejector, a turbo molecular pump for example.

It is desirable for the gas supply conduits (3a to 3g and 30a to 30n), or for the gas supply conduits (22 to 24), or for the valves equipped to those conduits and also for the buffer tank 12 to be formed of which inner surface with electrolytic polished SUS316.

By use of the electrolytic polished SUS316, it is advantageous not only preventing corrosion of their inner surface but also preventing contaminants charged from the inner surface of these to intrude into the gas flow of each conduits. Thus, the vapor growth plant is constructed with a dopant gas supplying apparatus 31 of which components include the gas supplying containers (200a to 200h), the multiple stage gas flow subsystem having the gas supply conduits (3a to 3g and 30a to 30n), the valves (9 to 11), the gas buffering means 12 and the ejector 51, and with the vapor-phase growth apparatus (41a to 41d).

Next, the working and its resultant effect of this embodiment are described below.

The operation for dopant gas supply noted below uses at once all of the eight gas supplying containers (200a to 200h) to supply dopant gas.

Preceding to explain the preferred operating condition, an undesirable operating condition is firstly described: if the primary pressure reducing valves 9 and 10 are used under simultaneous use of all the eight gas supplying containers, a small pressure difference between these two valves may occur, and by the pressure difference, though small in extent, causes gas flow rate difference from the pressure reducing valve with higher pressure to increase than that from the pressure reducing valve with lower pressure, which in consequence may fail to even each dopant gas flow rate supplied from these eight gas supplying containers.

Therefore, with the preferred operating condition of this invention, the above described two way valves which are equipped in parallel to the primary pressure reducing valves 9 and 10 are used, instead of using the primary pressure reducing valves 9 and 10.

On the production of thin film under the vapor deposition process by applying diborane gas ($B_2H_6$) as its dopant 1, the two way valves 7 and 8 are fully opened while all of cocks of the eight gas supplying containers (200a to 200h) filled with diborane gas ($B_2H_6$) of 120 kg/cm$^2$ are also opened.

The dopant gas 1 flown out from the left four gas supplying containers 200a, 200b, 200c and 200d into the gas supply conduit 3a are merged and mixed during flowing the conduit therein: more specifically, each dopant gas flow from the two of gas supplying containers 200a and 200b via the gas supply conduits 30a and 30b are merged and mixed on the confluence 4a to unite one stream in the gas supply conduits 30e while each dopant gas flow from the two of gas supplying containers 200c and 200d via the gas supply conduits 30c and 30d are merged and mixed on the confluence 4b to unite one stream in the gas supply conduits 30f, and then the generated two streams in the gas supply conduits 30e and 30f are merged and mixed on the confluence 5a to unite one stream which flows into the gas supply conduit 3a.

The gas stream in the gas supply conduit 3a then passes through the two way valve equipped in parallel to the pressure reducing valve 9 and flows into the gas supply conduit 3b. The gas stream in the gas supply conduit 3b then passes through the two way valve 7 and is conducted to the confluence 6.

On the other hand, the dopant gas 1 flown out from the right four gas supplying containers 200e, 200f, 200g and 200h into the gas supply conduit 3c are also merged and mixed during flowing the conduit therein: more specifically, each dopant gas flow from the two of gas supplying containers 200e and 200f via the gas supply conduits 30g and 30h are merged and mixed on the confluence 4c to unite one stream in the gas supply conduits 30m while each dopant gas flow from the two of gas supplying containers 200g and 200h via the gas supply conduits 30j and 30k are merged and mixed on the conflux 4d to unite one stream in the gas supply conduits 30n, and then the two streams generated are merged and mixed on the confluence 5b to unite one stream which flows also into the gas supply conduit 3c. The gas stream in the gas supply conduit 3c then passes through the two way valve equipped in parallel to the pressure reducing valve 10 and flows into the gas supply conduit 3d. The gas stream in the gas supply conduit 3d then passes through the two way valve 8 and is conducted to the confluence 6.

Further, both of the gas stream are then merged and mixed on the conflux 6 to unite one stream which flows into the gas supply conduit 3e. The mixed gas flow through passing of the gas supply conduit 3e is then subjected to the secondary pressure reducing valve 11 to reduce its pressure to 4 kg/cm$^2$, and flows into the gas supply conduit 3f. The decompressed gas stream in the gas supply conduit 3f is dividedly supplied to each vapor-phase growth apparatus (41a to 41d) via the gas buffer tank 12.

In the embodiment described above, each of dopant gas flow rate from each of eight gas supplying containers (200a to 200h) can be kept even, with merging and mixing them under a tournament-style networking manner above described.

This can also more effectively be attained with every gas supplying conduit to the respective confluence having the same inner diameter and the same length and the same bending configuration, so as to even each pressure drop to the respective confluence.

In consequence, each of the dopant gas flow from each of gas supplying container can offset gas concentration variance each other via gas supply conduits and respective confluences, which results in dopant gas supplying with lesser concentration variance.

Moreover, with more compact piping, saving space of piping can be attained.

Thus, with the multiple stage gas flow subsystem described above, an equalized constant flow rate of dopant gas from each of gas supplying containers can be supplied to respective confluence, and at once in the confluence each of the dopant gas flow can offset gas concentration variance each other to even, dopant gas with lesser concentration variance can be supplied. As a result, the system is able to supply a determined concentration of dopant gas flow in stable and for longer period, to the vapor-phase growth apparatus (41a to 41d).

Figure 2:
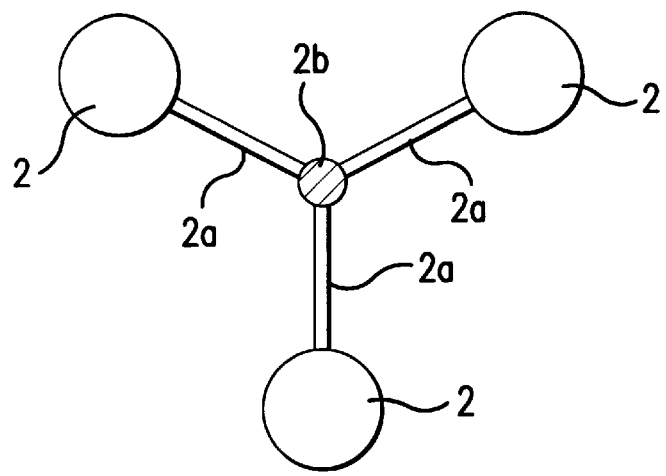
FIG. 2 is a plan view illustrating the essential part of an example of substantial gas conduction means according to the present invention to even dopant gas pressure drop between each gas supplying containers and each confluences, with three gas supplying containers equipped.
Figure 3:
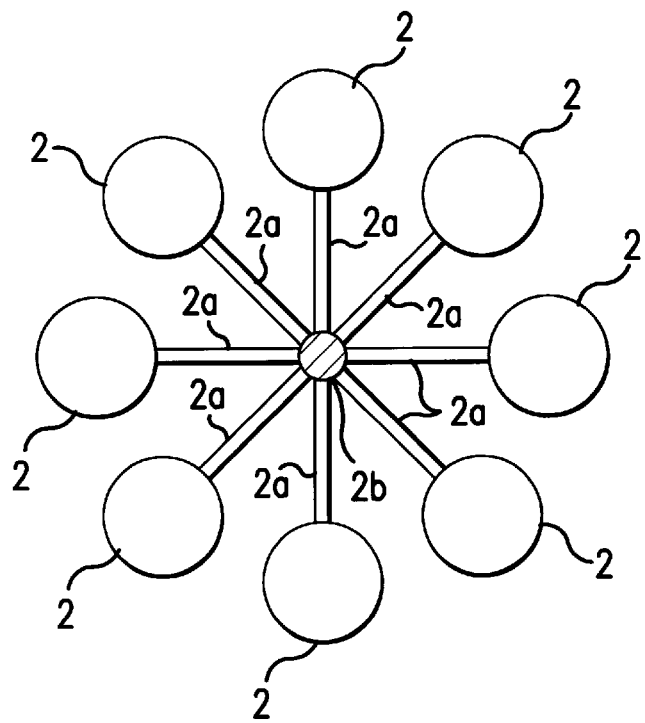
FIG. 3 is a plan view illustrating the essential part of an another example of substantial gas conduction means according to the present invention to even dopant gas pressure drop between each gas supplying containers and each confluence, with eight gas supplying containers equipped.

Effective embodiments of substantial configuration of gas conduction means to even pressure drop from the gas supplying containers to the respective confluence are illustrated by their plan view in FIG. 2 and FIG. 3.

The embodiment shown in the FIG. 2 has three gas supplying containers 2, 2 and 2 connected by three gas supply conduits 2a, 2a and 2a which are united to a confluence 2b. The three gas supply conduits 2a, 2a and 2a have the same inner diameter, the same length and the same bending configuration.

The embodiment shown in the FIG. 3 has eight gas supplying containers 2, 2, 2, 2, 2, 2, 2 and 2 connected by eight gas supply conduits 2a, 2a, 2a, 2a, 2a, 2a, 2a and 2a which are united to a confluence 2b, of which the eight gas supply conduits 2a, 2a, 2a, 2a, 2a, 2a, 2a and 2a have the same inner diameter, the same length and the same bending configuration.

Also by disposing a primary pressure reducing valve and a secondary pressure reducing valve in series, dopant gas pressure for supplying to vapor-phase growth apparatus can more stably be controlled to a predetermined value.

Since the system shown in the FIG. 1 has two groups of conduits (or piping) which are disposed in parallel, continuous operation can be attained by the following switching schedule of dopant gas supply: With this case, primary pressure reducing valves 9 and 10 are used. This operation schedule enjoys better operability than the previous operation schedule described heretofore with simultaneous use of all of eight gas supplying containers.

According to this operation schedule, during a former half operation period, the two way valve 7 is opened while the two way valve 8 is closed, thereby using solely the left four gas supplying containers 200a, 200b, 200c and 200d simultaneously. And when their residual pressure decrease to around 10 kg/cm$^2$, the former half operation period is terminated: then the operation proceeds to a latter half operation period, where the two way valve 7 is closed while the two way valve 8 is opened, thereby using solely the right four gas supplying containers 200e, 200f, 200g and 200h simultaneously.

While proceeding the latter half operation period, the four exhausted gas supplying containers 200a, 200b, 200c and 200d are replaced to new ones with dopant gas pressure of 120 kg/cm$^2$. Thus, by changing alternatively the four gas supplying containers to another four new ones, the two groups of gas supplying containers can effectively be used in turn.

In order to execute automatically the switching operation between the two groups of gas supplying containers, it is desirable to equip Pressure Indication Controllers (PIC) disposed to the primary circuit of the primary pressure reducing valves 9, 10 and replacing the said two way valves 7,8 to solenoid control valves respectively, by connecting each operation part of the said solenoid control valve to the said PIC.

With the configuration, immediate after detecting by the PIC the pressure to decrease to 10 kg/cm$^2$ for example, the two solenoid control valves are switched over, to control one of them being opened while the other being closed.

By request, an appending two way valve can be disposed on the gas supply conduit 3e in addition to the two way valves 7 and 8. Or a new two way valve can be disposed on the gas supply conduit 3e by removing the existing two way valves 7 and 8. In the latter case, however, dopant gas flow cannot be switched.

During replacement of a gas supplying container at the gas supply conduits 3a or 3c, contaminants, dust or other undesirable particles clinging to worker's wear may intrude via opening to those conduits. In such cases according to the invention, the above described gas purging apparatus having a purging gas supplying conduit 22 and a purging gas discharge conduit 23 and a decompression exhaust conduit 24 is used.

For example upon replacing the left four exhausted gas supplying containers 200a, 200b, 200c and 200d, firstly the two way valve 7 is closed, and just before or just after releasing of the gas supply conduits (30a to 30d) to remove from these containers, among twelve in total two way valves (22a to 24d), the two way valves 22a, 22b, 23a and 23b to be full opened while the rest of them to be full closed. With this operation, nitrogen gas is supplied as a purging gas through the purging gas supplying conduit 22 into the gas supply conduits (3a, 3b, and 30a to 30d) while a part of nitrogen gas in these gas supply conduits is discharged from both of each open end of the four gas supply conduits (30a to 30d) and the open end of the purging gas discharge conduit 23.

During this operation the left four exhausted gas supplying containers 200a, 200b, 200c and 200d are replaced to the new four gas supplying containers which are filled up dopant gas at a pressure of 120 kg/cm$^2$, and after their replacement all of the cock of these gas supplying containers to be full closed. By this operation, the nitrogen gas cleans the inner side of the gas supply conduits (3a, 3b, and 30a to 30d), also preventing contaminants to intrude into the gas supplying containers 200a, 200b, 200c and 200d through the container-side end of the gas supply conduits (30a to 30d).

After closing the two way valves 22a, 22b, 23a and 23b, starts the ejector 51 thereby discharging residual nitrogen gas in the gas supply conduits (3a, 3b, and 30a to 30d) through the decompression exhaust conduit 24. On this discharging, among twelve in total two way valves (22a to 24d) the two way valves 24a and 24b to be full opened while the rest of them to be full closed.

The discharging operation continues till the pressure in the conduit reaches to $10^{-4}$ to $10^{-5}$ Torr, for example. Then the all cock of the newly installed gas supplying containers to be full opened, thereby holding high pressure state in the gas supply conduits (30a to 30d, 30e, 30f and 3a).

According to the vapor-phase growth plant illustrated in the FIG. 1, which has a dopant gas supplying apparatus comprising a plurality of dopant gas supplying containers, and a multiple stage gas flow subsystem with a plurality of dopant gas supply conduits therein, of which said dopant gas supply conduits form a tournament-like network with a plurality of confluences on which the dopant gas supply conduits are united and the gas flows therein are merged for subjection to even mixing, which results in gradual decreasing of the number of the dopant gas supply conduits as the dopant gas flows proceed in the multiple stage gas flow subsystem.

Since the buffer tank is equipped together with the pressure reducing valves, the dopant gas which is highly evened its pressure and its concentration can be supplied to the vapor-phase growth apparatus, thereby affording stable production of vapor-phase growth products with extremely lessened quality variance.

The dopant gas supplying apparatus described compiles the gas supply conduits within it to divide into two groups, each of which can be used alternatively by switching of these. Therefore, the system can supply dopant gas continuously and for a longer period. Also the operation of the dopant gas supplying apparatus can be simplified.

The dopant gas supplying apparatus described above also has a buffer tank and two stage pressure reducing valves in tandem connection. Upon alternative use of the above described two groups by switching operation, the two stage pressure reducing valves suppress dopant gas pressure fluctuation which may occur due to the switching. Also, the buffer tank works to prevent the impact of pressure fluctuation which may occur due to ON/OFF operation of some vapor-phase growth apparatus, to influence to other vapor-phase growth apparatus.

Thus, the dopant gas supplying apparatus of this invention can supply high pressure dopant gas with highly evened for both in its concentration and its pressure, stably and successively for a longer period to the chemical processing apparatus.

Also, since the dopant gas supplying apparatus of this invention is equipped with a gas purging apparatus having purging gas supplying means, purging gas discharge means and decompression exhaust means, the system is free from intruding by contaminants in the gas supply conduits upon replacement of the gas supplying containers. With this function, there is no need to perform test production after replacing of the gas supplying containers for examining the quality and for adjusting production condition to maintain its quality, thereby greatly improve productivity.

Also, the dopant gas supplying apparatus can perform the gas purging operation and the decompression exhaust operation to many gas supplying containers at once, the efficiency of gas supplying container replacement operation improves significantly.

This invention will be described more specifically below with reference to the working examples illustrated in the drawings annexed hereto.

EXAMPLE

As shown in the FIG. 1, eight gas supplying containers of 47 liter capacity for each filled with hydrogen diluted diborane gas ($B_2H_6$) were set to a vapor-phase growth plant. The concentration and pressure of the diborane gas in the right four gas supplying containers were, (96.0 ppm, 122 atm ), (98.5 ppm, 121 atm), (101.0 ppm, 121 atm), (103.5 ppm, 122 atm) while those in the left four gas supplying containers were (96.5 ppm, 121 atm ), (99.0 ppm, 121 atm), (100.5 ppm, 122 atm), (104.5 ppm, 121 atm), respectively.

During one month operation as the former half period, the right four gas supplying containers were used. By setting the primary pressure of the pressure reducing valve 10 to 8 kg/cm$^2$, the secondary pressure of the pressure reducing valve 11 to 4 kg/cm$^2$ respectively, the $B_2H_6$ gas were supplied to four vapor-phase growth apparatus 41a, 41b, 41c and 41d, each of which is one-piece type equipped with two units of growing vessels in it.

At the two vapor-phase growth apparatus 41a and 41b, SiHCl$_3$ (Trichlorosilane) gas and $B_2H_6$ gas were supplied to single crystalline p-type silicon substrate with resistivity ranges from 0.01 to 0.02 ohm·cm, thickness of 725 micrometer, and 200 mm in diameter, under growth temperature of 1100 centigrade with growth rate of 4.0 micrometer/min, for obtaining of single crystalline p-type silicon thin film with the target thickness of 6 micrometer and the target resistivity of 6 ohm·cm.

Also, at the rest two vapor-phase growth apparatus 41c and 41d, the same gas described above were supplied to single crystalline p-type silicon substrate with the same specification described above under the same growth condition described above, for obtaining of single crystalline p-type silicon thin film with the target thickness of 4 micrometer and the target resistivity of 2 ohm·cm.

In this case, for attaining of the target resistivity, dopant gas flow rate supplied to the vapor-phase growth apparatus 41a, 41b, 41c and 41d were 62 cc/min, 60 cc/min, 191 cc/min and 187 cc/min respectively, which values were set according to their characteristic tables.

After the one month operation (the former half of period ) of single crystalline p-type silicon thin film growth, the right four $B_2H_6$ gas supplying containers were switched to the left four gas supplying containers, and the latter half period of successive one month was started. In the latter case, the primary gas pressure of the pressure reducing valve 9 were set to 8 kg/cm$^2$ for supplying $B_2H_6$ gas to all the vapor-phase growth apparatus 41a, 41b, 41c and 41d, while the film growth condition were set to same to the former half of period.

After the two-months operation, the resistivity of the grown thin films were examined by Hg probe method. The sampling wafers were extracted at intervals of 25 wafers produced in each of the vapor-phase growth apparatus. The sampling points atom for each sampling wafer were the center of the wafer, and the four points at the inner positions radially 10 mm apart from the outer edge, the five resulted points in total for each wafer.

By measuring these, the average resistivity of the five sampling points for each substrate are listed in TABLE 1. In the table, each variance of resistivity (%) is obtained by the following equation;

((Average resistivity in the latter half period–Average resistivity in the former half period )/Average resistivity in the former half period)×100

TABLE 1

| Vapor-phase Growth Apparatus | Average resistivity in the former half period | Average resistivity in the latter half period | Variance of resistivity |
|---|---|---|---|
| 41a | 6.02 ohm · cm | 6.02 ohm · cm | +1.0% |
| 41b | 6.01 ohm · cm | 6.06 ohm · cm | +0.8% |
| 41c | 1.98 ohm · cm | 2.01 ohm · cm | +1.5 |
| 41d | 2.01 ohm · cm | 2.03 ohm · cm | +1.0% |

As shown in the TABLE 1, the variance of resistivity attains as small value as ±1.5%, at its maximum. Thus, by applying the plant illustrated in the FIG. 1, it is ascertained that the single crystalline silicon thin film of lesser resistivity variance can be produced without altering the growth condition (dopant gas flow rate, for example), though the gas supplying containers were switched during the two-month of film growth duration.

Comparative Example

Figure 4:
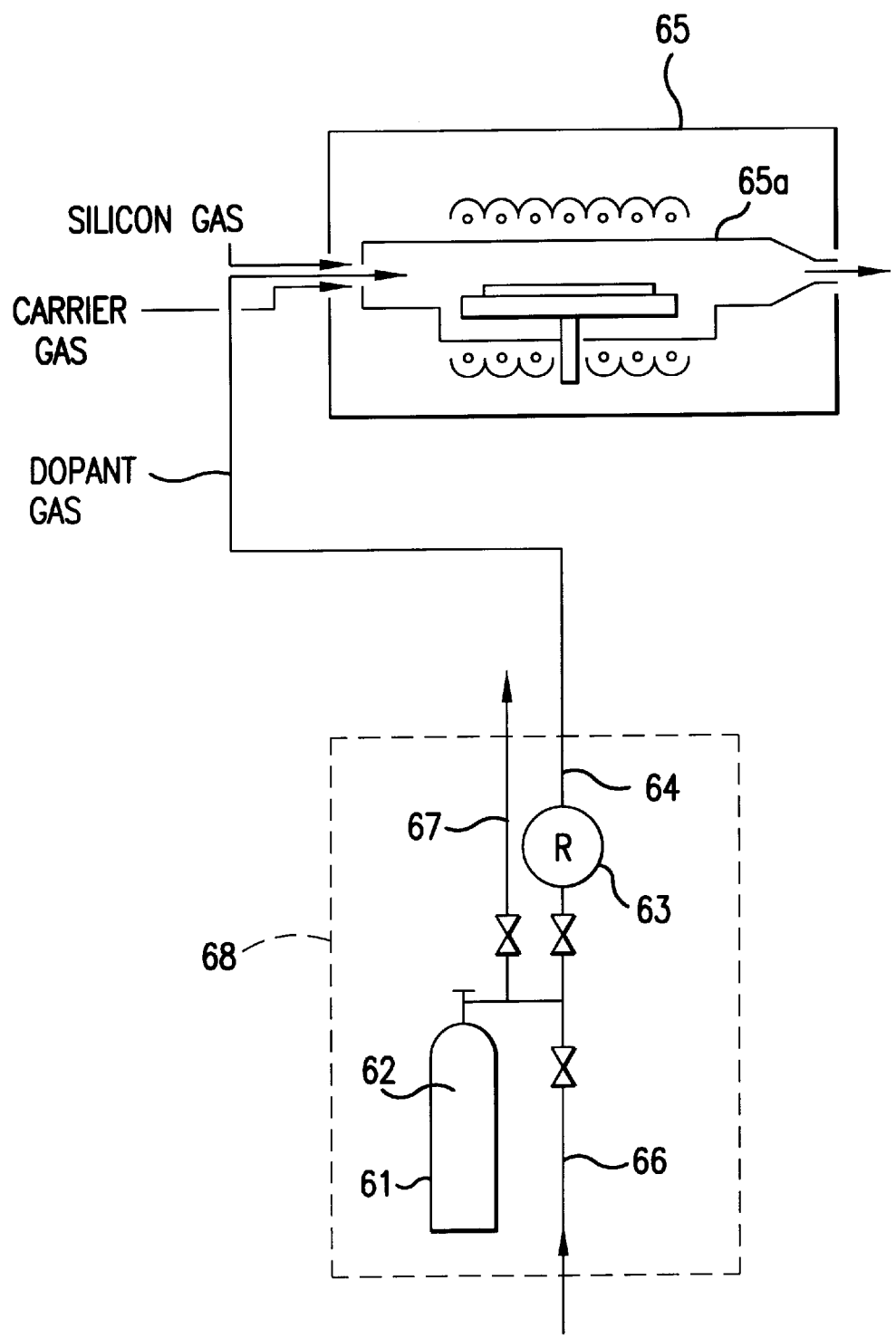
FIG. 4 is a flow sheet for representing of a prior art vapor-phase growth plant.

A gas supplying container of 47 liter capacity filled with hydrogen diluted diborane gas ($B_2H_6$) was set to a vapor-phase growth plant shown in the FIG. 4. The concentration and pressure of the diborane gas in the gas supplying container were 103.0 ppm and 122 atm.

By setting the secondary pressure of the pressure reducing valve 63 to 4 kg/cm$^2$, the $B_2H_6$ gas was supplied to the vapor-phase growth apparatus 65 of one-piece type equipped with two units of growing vessels in it.

At the vapor-phase growth apparatus 65, SiHCl$_3$ (Trichlorosilane) gas and $B_2H_6$ gas were supplied to single crystalline p-type silicon substrate with its resistivity ranging from 0.01 to 0.02 ohm·cm, thickness of 725 micrometer, and 200 mm in diameter, under growth temperature of 1100 centigrade with growth rate of 4.0 micrometer/min, for obtaining of single crystalline p-type silicon thin film with the target thickness of 4 micrometer and the target resistivity of 2 ohm·cm.

In this case, for the purpose of setting of the growth condition, the relations between dopant gas flow rate and thin film resistivity had previously been investigated by test running.

With three times of the test running, the adequate dopant gas flow rate for attaining the target resistivity was found to be 181 cc/min. The obtained gas flow rate was consequently adopted to this reaction.

After the one month operation, the resistivity of the grown thin films were examined by Hg probe method. The sampling wafers were extracted at intervals of 25 wafers produced in the vapor-phase growth apparatus 65. The sampling point for each sampling substrate were the same to that in the Example 1 described above.

By measuring these, the average resistivity of the five sampling points was 1.99 ohm·cm.

On continuing a month of thin film growth, the pressure of the $B_2H_6$ supplying container was degraded below 10 atm, therefore it was replaced to another container of which B2H6 concentration and pressure were 97.0 ppm and 121 atm. By setting the secondary pressure of the pressure reducing valve 63 to 4 kg/cm$^2$, and by setting also the growth condition to the same to those described above, 25 wafers in total were produced.

By extracting one wafer among these 25 wafers, resistivity of the grown film were measured with the same method described above. The measured average resistivity of the five sampling points was 2.12 ohm·cm, which suffering of large increase of ±6.5%.

Therefore the production was ceased at that point, and twice of test running were attempted. By the test run, the adequate doping gas flow rate for the new gas supplying container was confirmed to 192 cc/min. Under this growth condition, additional 1000 wafers were produced. By extracting one sample wafer for every 25 produced wafers, 40 sampling wafers were obtained. The measured average resistivity of the five sampling points for each wafer was 2.01 ohm·cm, which showed a decrease to the previous desirable value.

As already obvious by the explanation above, an important advantage of this invention is for enabling supply of high pressure gas with highly evened for both in its concentration and its pressure, stably and successively for a longer period to the chemical processing apparatus.

Another advantage of this invention is for enabling stable production of vapor-phase growth products with extremely lessened their variance in quality.

A further advantage of this invention is for realizing the improved simplified operation of the gas supplying apparatus, and there is no need to perform test production after replacing of the gas supplying containers for examining the quality.

Another advantage of this invention is for enabling continuous chemical processing for a longer period, thereby greatly improve productivity.

A further advantage of this invention is for enabling the efficiency of gas supplying container replacement operation to improve significantly.

Having illustrated and described the principles of the invention in a preferred embodiment thereof, it should be readily apparent to those skilled in the art that the invention can be modified in arrangement and detail without departing from such principles. We claim all of modifications coming within the spirit and scope of the accompanying claims.

What is claimed is:

1. A gas supplying apparatus for supplying high pressure dopant gas flowing from gas supplying containers which are filled with a single dopant gas therein, through gas conduction means equipped with pressure reducing valves, to at least one chemical processing apparatus, the gas supplying apparatus comprising:

(a) a plurality of single dopant gas type supplying containers each of which having an outlet for simultaneous supplying of said single dopant gas flow therefrom; and (b) a gas conduction means for conducting said single dopant gas flow having a plurality of gas supply conduits each of which being connected to each outlet of said gas supplying containers, wherein the gas supply conduits form a multiple stage network with a plurality of confluences which merge and unite said gas supply conduits respectively along with a gas flow direction, thereby reducing the number of gas supply conduits, wherein a final stage of said multiple stage network is formed at a final stage confluence of single gas type supply conduits thereof, wherein the final stage confluence is connected through at least one pressure reducing valve to at least one chemical processing apparatus, wherein dopant gas flow rate of each single dopant gas supplying container flows evenly out therefrom, and wherein there is an even pressure drop within said gas supply conduits jointly connected between each of said outlets of each said gas supplying containers and said final stage confluence therethrough.

2. A gas supplying apparatus as in claim 1 wherein the gas conduction means gas supply conduits comprise a multiple stage tournament style network, formed by merging and uniting said gas supply conduits on said respective confluences.

3. A gas supplying apparatus as in claim 1, further comprising at least one gas buffering means inserted between an outlet of said pressure reducing valve at the final stage confluence and respective chemical processing apparatus.

4. A gas supplying apparatus as in claim 1, further comprising at least one gas purging apparatus equipped with at least one purging gas supplying conduit with at least one purging gas discharge conduit and with at least one decompression exhaust conduit.

5. A gas supplying apparatus as in claim 1, in which said each gas supplying conduit has the same inner diameter and the same length and the same bending configuration so as to provide an even pressure drop within said gas conduction means disposed between said each gas supplying container and respective said confluence.

6. A gas supplying apparatus as in claim 1, wherein said chemical processing apparatus is a vapor-phase growth apparatus.

7. A vapor-phase growth plant having at least one gas supplying container containing a high pressure dopant gas, at least one vapor-phrase growth apparatus and a dopant gas conduction means together with at least one pressure reducing valve, for growing a thin film in the presence of said dopant gas supplied by said dopant gas conduction means on substrate disposed within said vapor-phase growth apparatus, the vapor growth plant comprising:

(a) a plurality of single dopant gas supplying containers each having an outlet for simultaneously supplying said single dopant gas flow; and (b) a gas conduction means for conducting said single dopant gas flow having a plurality of gas supply conduits each of which is connected to each outlet of said single dopant gas supplying containers, wherein the gas supply conduits form a multiple stage network with a plurality of confluences which merge and unite said gas supply conduits along with said single dopant gas flow, thereby reducing the number of gas supply conduits, wherein the final stage of said multiple stage network is formed at the final stage confluence of single dopant gas supply conduit, wherein the final confluence is connected through at least one pressure reducing valve to at least one vapor-phase growth apparatus, wherein single dopant gas flow rate of said each gas supplying container flows evenly out therefrom, and wherein there is an even pressure drop within said single dopant gas supply conduits jointly connected between each of said outlet of each said single dopant gas supplying containers and said final stage confluence.

8. A vapor growth plant as in claim 7 wherein the thin film is a single crystalline silicon semiconductor thin film.

* * * * *